United States Patent
Fukunaga

(10) Patent No.: US 7,476,904 B2
(45) Date of Patent: Jan. 13, 2009

(54) PHOTOELECTRIC CONVERTING FILM STACK TYPE SOLID-STATE IMAGE PICKUP DEVICE

(75) Inventor: Toshiaki Fukunaga, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/007,316

(22) Filed: Jan. 9, 2008

(65) Prior Publication Data
US 2008/0135828 A1   Jun. 12, 2008

Related U.S. Application Data

(62) Division of application No. 11/080,539, filed on Mar. 16, 2005, now abandoned.

(30) Foreign Application Priority Data
Mar. 17, 2004   (JP) .............................. 2004-076068

(51) Int. Cl.
*H01L 27/15* (2006.01)
(52) U.S. Cl. .......................................... 257/80; 257/79
(58) Field of Classification Search .................. 257/79, 257/80
See application file for complete search history.

(56) References Cited

U.S. PATENT DOCUMENTS

2002/0050289 A1   5/2002   Wada et al.
2004/0067324 A1   4/2004   Lazarev et al.
2004/0150330 A1   8/2004   Suh

FOREIGN PATENT DOCUMENTS

| JP | 58-103165 A | 6/1983 |
| JP | 2002-83946 A | 3/2002 |
| JP | 3405099 B2 | 3/2003 |

OTHER PUBLICATIONS

B.O. Dabbousi et al.,CdSe)ZnS Core-Shell Quantum Dots: Synthesis Characterization of a Size Series of Highly Luminescent Nanocrystallites which appeared in the Journal of Physical Chemistry B (1997), 101 pp. 9463-9475.

*Primary Examiner*—Long Pham
(74) *Attorney, Agent, or Firm*—Sughrue Mion, PLLC

(57) ABSTRACT

A photoelectric converting film stack type solid-state image pickup device comprising: a semiconductor substrate in which a signal read circuit is formed; and at least one photoelectric converting film interposed between two electrode films, said at least one photoelectric converting film being stacked above the semiconductor substrate, wherein a signal corresponding to an intensity of incident light is read outside by the signal read circuit, the signal being generated by photoelectric conversion with the photoelectric converting film, wherein the photoelectric converting film comprises: a first layer comprising: an ultrafine particle including (i) a quantum dot contributing to the photoelectric conversion and (ii) a material having a band gap larger than that of the quantum dot, the quantum dot being coated with the material; and a hole transport layer stacked on the first layer.

10 Claims, 5 Drawing Sheets

PHOTOELECTRIC CONVERTING FILM STACK TYPE SOLID-STATE IMAGE PICKUP DEVICE

This is a divisional of application Ser. No. 11/080,539 filed Mar. 16, 2005 now abandoned, which claims priority from Japanese Patent Application No 2004-076068 filed on Mar. 17, 2004 the disclosures of which are incorporated by reference in their entirety.

BACKGROUND OF THE INVENTION

1. Field of the Invention

The present invention relates to a photoelectric converting film stack type solid-state image pickup device fabricated by stacking a photoelectric converting film on a semiconductor substrate having formed on the surface thereof a signal read circuit.

2. Description of the Related Art

As for the photoelectric converting film stack type solid-state image pickup device, a prototype device is described, for example, in JP-A-58-103165. In this solid-state image pickup device, three photosensitive layers are stacked on a semiconductor substrate, and electrical signals of red (R), green (G) and blue (B) detected by respective photosensitive layers are read out by MOS circuits formed on the semiconductor substrate surface.

Solid-state image pickup devices having such a constitution were proposed in the past and thereafter, CCD-type image sensors or CMOS-type image sensors where a large number of light-receiving parts (photodiodes) are collectively stacked on the semiconductor substrate surface part and color filters of red (R), green (G) and blue (B) are stacked on respective light-receiving parts have made remarkable progress. At present, an image sensor where hundreds of light-receiving parts (pixels) are clustered on one chip is mounted on a digital still camera.

However, CCD-type image sensors or CMOS-type image sensors are reaching the limit of their technical progress and come to encounter a problem of bad production yield because the opening size of one light-receiving part is about 2 μm and approximated to the wavelength order of incident light.

Furthermore, the upper limit of the quantity of photoelectric charges accumulated in one minute light-receiving part is as small as about 3,000 electrons and with this number of electrons, it is difficult to clearly express 256 gradations. Therefore, CCD-type or CMOS-type image sensors can be hardly expected to be more enhanced in view of pictorial quality or sensitivity.

As a solid-state image pickup device capable of solving these problems, the solid-state image pickup device proposed in JP-A-58-103165 is taken notice of, and image sensors described in Japanese Patent No. 3,405,099 and JP-A-2002-83946 are newly proposed.

In the image sensor described in Japanese Patent No. 3,405,099, a medium having dispersed therein ultrafine silicon particles is used for the photoelectric converting layer and by stacking three photoelectric converting layers differing in the particle diameter of the ultrafine particle on a semiconductor substrate, electrical signals according to respective intensities of red, green and blue lights received are generated by respective photoelectric converting layers.

In the image sensor described in JP-A-2002-83946, similarly, three nanosilicon layers differing in the particle diameter are stacked on a semiconductor substrate, and electrical signals of red, green and blue colors detected by respective nanosilicon layers are each read out into an accumulation diode formed on the surface part of the semiconductor substrate.

However, since the ultrafine particle used is silicon in both of Japanese Patent No. 3,405,099 and JP-A-2002-83946, an electron-hole pair generated upon receiving light cannot be satisfactorily prevented from recombining on the ultrafine particle surface and this causes a problem that the performance as a solid-state image pickup device is not satisfied.

On the other hand, studies of ultrafine particles are introduced in B. O. Dabbousi et al., "(CdSe)ZnS Core-Shell Quantum Dots: Synthesis and Characterization of a Size Series of Highly Luminescent Nanocrystallites", *J. Phys. Chem. B* 1997, 101, 9463-9475, though this is not related to a solid-state image pickup device. "(CdSe)ZnS Core-Shell Quantum Dots Synthesis and Characterization of a Size Series of Highly Luminescent Nanocrystallites" describes an ultrafine particle obtained by coating the periphery of a CdSe quantum dot with ZnS. This CdSe quantum dot with ZnS shell is advantageous in that the electron-hole pair can be prevented from surface recombination as compared with an ultrafine silicon particle.

In order to practically use the photoelectric converting film stack type solid-state image pickup device, what material is used to form the photoelectric converting film is present as a problem. This problem can be overcome by using a CdSe quantum dot with ZnS shell introduced in B. O. Dabbousi et al., "(CdSe)ZnS Core-Shell Quantum Dots: Synthesis and Characterization of a Size Series of Highly Luminescent Nanocrystallites", *J. Phys. Chem. B* 1997, 101, 9463-9475 in place of the ultrafine silicon particle described in Japanese Patent No. 3,405,099 and JP-A-2002-83946.

However, it is necessary to solve another problem that even when a CdSe quantum dot with an ZnS shell is merely dispersed in a medium and formed into a film and the film (photoelectric converting film) is interposed between upper and lower transparent electrode films and applied with a voltage, the photoelectric charges (signal charges) cannot be efficiently taken out.

SUMMARY OF THE INVENTION

An object of the present invention is to provide a photoelectric converting film stack type solid-state image pickup device where when a photoelectric converting film, for example, using a CdSe quantum dot with ZnS shell is used to fabricate the solid-state image pickup device, the photoelectric charges can be efficiently taken out from the photoelectric converting film.

According to the invention, there is provided a photoelectric converting film stack type solid-state image pickup device comprising: a semiconductor substrate in which a signal read circuit is formed; and at least one photoelectric converting film interposed between two electrode films, said at least one photoelectric converting film being stacked above the semiconductor substrate, wherein a signal corresponding to an intensity of incident light is read outside by the signal read circuit, the signal being generated by photoelectric conversion with the photoelectric converting film, wherein the photoelectric converting film comprises: a first layer comprising: an ultrafine particle including (i) a quantum dot contributing to the photoelectric conversion and (ii) a material having a band gap larger than that of the quantum dot, the quantum dot being coated with the material; and a hole transport layer stacked on the first layer.

By virtue of this constitution, the signal charges generated upon entering of light into the quantum dot can be efficiently read out from the photoelectric converting film.

According to the invention, there is provided the photoelectric converting film stack type solid-state image pickup device, wherein the hole transport layer comprises a semiconductor having a bad gap larger than that of the quantum dot.

By virtue of this constitution, the signal charges can be more efficiently taken out from the photoelectric converting film.

According to the invention, there is provided the photoelectric converting film stack type solid-state image pickup device, wherein the semiconductor of the hole transport layer is doped with an impurity.

By virtue of this constitution, the signal charges can be more easily read out from the photoelectric converting film.

According to the invention, there is provided the photoelectric converting film stack type solid-state image pickup device, wherein the hole transport layer comprises an organic film.

By virtue of this constitution, a conventionally developed organic film can be used.

According to the invention, there is provided the photoelectric converting film stack type solid-state image pickup device, wherein the first layer further comprises an electron transport layer, and the ultrafine particle is dispersed in the electron transport layer.

By virtue of this constitution, the signal charges can be more easily and efficiently read out from the photoelectric converting film.

According to the invention, there is provided the photoelectric converting film stack type solid-state image pickup device, wherein the quantum dot comprises CdSe or CdS and the material coated on the quantum dot is ZnSe or ZnS.

By virtue of this constitution, the electron-hole pair generated upon entering of light is prevented from recombining.

According to the invention, there is provided the photoelectric converting film stack type solid-state image pickup device, wherein said at least one photoelectric converting film comprises three photoelectric converting film layers which are stacked through a transparent insulating film, each of said at least one photoelectric converting film being interposed between two transparent electrode films.

By virtue of this constitution, a color image can be picked up.

According to the invention, there is provided the photoelectric converting film stack type solid-state image pickup device, wherein an average particle diameter of the ultrafine particle in each of said photoelectric converting films is determined such that first one of the three photoelectric converting film layers has a light absorption maximum at a wavelength of 400 to 500 nm, second one of the three photoelectric converting film layers has a light absorption maximum at a wavelength of 500 to 560 nm, and third one of the three photoelectric converting film layers a light absorption maximum at a wavelength of 560 to 640 nm.

By virtue of this constitution, image data separated into three primary colors of red (R), green (G) and blue (B) can be taken out.

According to the invention, there is provided the photoelectric converting film stack type solid-state image pickup device, wherein said at least one photoelectric converting film comprises four photoelectric converting film layers which are stacked through a transparent insulating film, each of said at least one photoelectric converting film being interposed between two transparent electrode films.

By virtue of this constitution, the signals can be variously processed and a color image with good color reproducibility can be picked up.

According to the invention, there is provided the photoelectric converting film stack type solid-state image pickup device, wherein an average particle diameter of the ultrafine particle in each of said photoelectric converting films is determined such that first one of the four photoelectric converting film layers has a light absorption maximum at a wavelength of 420 to 480 nm, second one of the four photoelectric converting film layers has a light absorption maximum at a wavelength of 480 to 520 nm, third one of the four photoelectric converting film layers a light absorption maximum at a wavelength of 520 to 560 nm, and fourth one of the four photoelectric converting film layers a light absorption maximum at a wavelength of 560 to 620 nm.

By virtue of this constitution, a color image with more excellent color reproducibility can be picked up.

According to the invention, there is provided the photoelectric converting film stack type solid-state image pickup device, wherein a red color signal amount is determined by subtracting a second amount of signals detected by the second photoelectric converting film layer from a fourth amount of signals detected by the fourth photoelectric converting film layer.

By virtue of this constitution, the red color can be reproduced according to the human luminous efficacy.

DETAILED DESCRIPTION OF THE INVENTION

Figure 1:
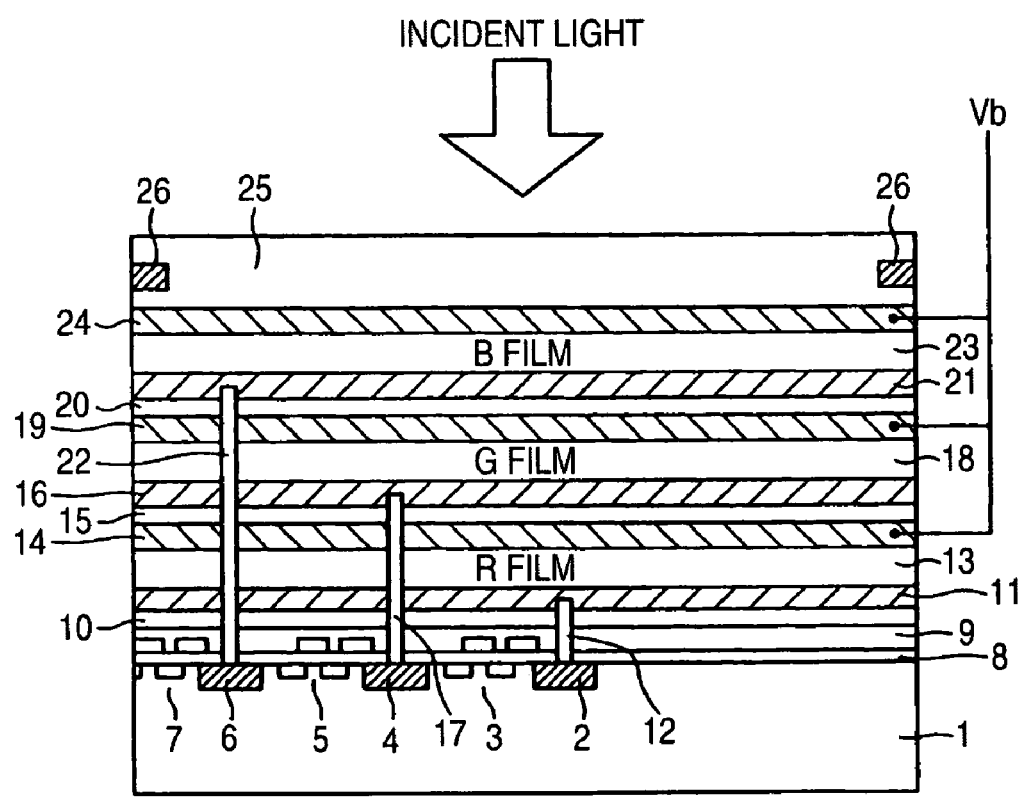
FIG. 1 is a cross-sectional schematic view of one pixel portion in the photoelectric converting film stack type solid-state image pickup device having a three-layer structure according to one embodiment of the present invention.

One embodiment of the present invention is described below by referring to the drawings.

FIG. 1 is a cross-sectional schematic view of one pixel portion of the photoelectric converting film stack type solid-state image pickup device according to one embodiment of the present invention. This embodiment takes a constitution such that photoelectric converting films are stacked in three layers to take out electrical signals corresponding to three primary colors of red (R), green (G) and blue (B), namely, a constitution of picking up a color image, but a constitution of picking up a monochromatic image, for example, a black-and-white image, by providing only one photoelectric converting film layer may also be employed.

In FIG. 1, a high-concentration impurity region 2 for accumulating the red color signal, an MOS circuit 3 for reading out the red color signal, a high-concentration impurity region 4 for accumulating the green signal, an MOS circuit 5 for reading out the green signal, a high-concentration impurity region 6 for accumulating the blue signal, and an MOS circuit 7 for reading out the blue signal are formed on the surface part of a P-well layer formed on an n-type silicon substrate.

The MOS circuits 3, 5 and 7 each comprises impurity regions for source and drain formed on the semiconductor substrate surface and a gate electrode formed through a gate insulating film 8. The upper part of these gate insulating film 8 and gate electrodes is flattened by stacking an insulating film 9 thereon. A light-shielding film is sometimes formed on the insulating film 9, but when a light-shielding film is formed, an insulating film 10 is further stacked thereon so as to insulate the light-shielding film, because the light-shielding film is a metal thin film in many cases. In the case of not providing a light-shielding film there, the insulating films 9 and 10 may be an integrated film.

The signals according to the signal charge amount, which are accumulated in the high-concentration impurity regions 2, 4 and 6 for accumulating the above-described color signals, are read out by the MOS circuits 3, 5 and 7 and further taken outside by read-out electrodes (not shown) formed on the semiconductor substrate, and the constitution thereof is the same as that of the related-art CMOS-type image sensors.

This example takes a constitution such that the signal according to the signal charge amount is read out by the MOS circuit, but a constitution where the electric charges accumulated in the high-concentration impurity regions 2, 4 and 6 for accumulating the color signals are, similarly to the related-art CCD-type image sensors, moved along a vertical transfer path and read outside along a horizontal transfer path may also be employed.

The above-described constitutions are fabricated by the semiconductor process for the related-art CCD-type image sensors or CMOS-type image sensors, and a photoelectric converting film stack type solid-state image pickup device is produced by adding the following constitutions.

A transparent electrode film 11 is formed on the insulating film 10 shown in FIG. 1. This transparent film 11 is energized by an electrode 12 and conducted to the high-concentration impurity region 2 for accumulating the red signal. The electrode 12 is electrically connected only to the transparent electrode film 11 and the high-concentration impurity region 2, but is insulated from others. Thereafter, a photoelectric converting film 13 for red color detection is formed on the transparent electrode film 11 and a transparent electrode film 14 is further formed thereon. That is, in this constitution, a photoelectric converting film 13 is interposed between a pair of transparent electrode films 11 and 14. Incidentally, the electrode film 11 as the lowermost layer may be made opaque to serve also as a light-shielding film.

A transparent insulating film 15 is formed on the transparent electrode film 14 and a transparent electrode film 16 is formed thereon. This transparent electrode film 16 is energized by an electrode 17 and conducted to the high-concentration impurity region 4 for accumulating the green signal. The electrode 17 is electrically connected only to the transparent electrode film 16 and the high-concentration impurity region 4, but is insulated from others. Thereafter, a photoelectric converting film 18 for green color detection is formed on the transparent electrode film 16 and a transparent electrode film 19 is formed thereon. That is, in this constitution, a photoelectric converting film 18 is interposed between a pair of transparent electrode films 16 and 19.

A transparent insulating film 20 is formed on the transparent electrode film 19 and a transparent electrode film 21 is formed thereon. This transparent electrode film 21 is energized by an electrode 22 and conducted to the high-concentration impurity region 6 for accumulating the blue signal. The electrode 22 is electrically connected only to the transparent electrode film 21 and the high-concentration impurity region 6, but is insulated from others. Thereafter, a photoelectric converting film 23 for blue color detection is formed on the transparent electrode film 21 and a transparent electrode film 24 is formed thereon. That is, in this constitution, a photoelectric converting film 23 is interposed between a pair of transparent electrode films 21 and 24.

A transparent insulating film 25 is formed as an uppermost layer and in this embodiment, a light-shielding film 26 of limiting the incidence area of incident light into this pixel is provided in the transparent insulating film 25. The reason why the light-shielding film 26 is provided in the uppermost layer in this embodiment is because color mixing between pixels can be more decreased. As for the homogeneous transparent electrode film, a thin film of tin oxide ($SnO_2$), titanium oxide ($TiO_2$), indium oxide ($InO_2$), indium oxide-tin (ITO), indium oxide-zinc (IZO) or $InGaO_3(ZnO)_5$(IGZO) is used, but the present invention is not limited thereto. Examples of the method for forming this film include a laser ablation method and a sputtering method.

The photoelectric converting films 23, 18 and 13 have fundamentally the same constitution but are differing in the particle diameter of the CdSe quantum dot with ZnS shell provided in the film. The CdSe quantum dot with ZnS shell in the photoelectric converting film 23 for blue color detection has a smallest particle diameter, the CdSe quantum dot with ZnS shell in the photoelectric converting film 18 for green color detection has an intermediate particle diameter, and the CdSe quantum dot with ZnS shell in the photoelectric converting film 33 for red color detection has a largest particle diameter. These particle diameters all are on the nanometer order.

For example, the average particle diameter of the CdSe quantum dot for blue color detection is preferably on the order of 1.7 to 2.5 nm, the average particle diameter of the CdSe quantum dot for green color detection is preferably on the order of 2.5 to 5 nm, and the average particle diameter of the CdSe quantum dot for red color detection is preferably on the order of 5 to 10 nm.

These particle diameters each is selected to give large light absorption at the corresponding wavelength and generate a great number of electron-hole pairs. More specifically, the particle size is selected in the photoelectric converting film 23 for blue color detection to give a light absorption maximum of 400 to 500 nm, in the photoelectric converting film 18 for green color detection to give a light absorption maximum of 500 to 560 nm, and in the photoelectric converting film 13 for red color detection to give a light absorption maximum of 560 to 640 nm.

Figure 2:
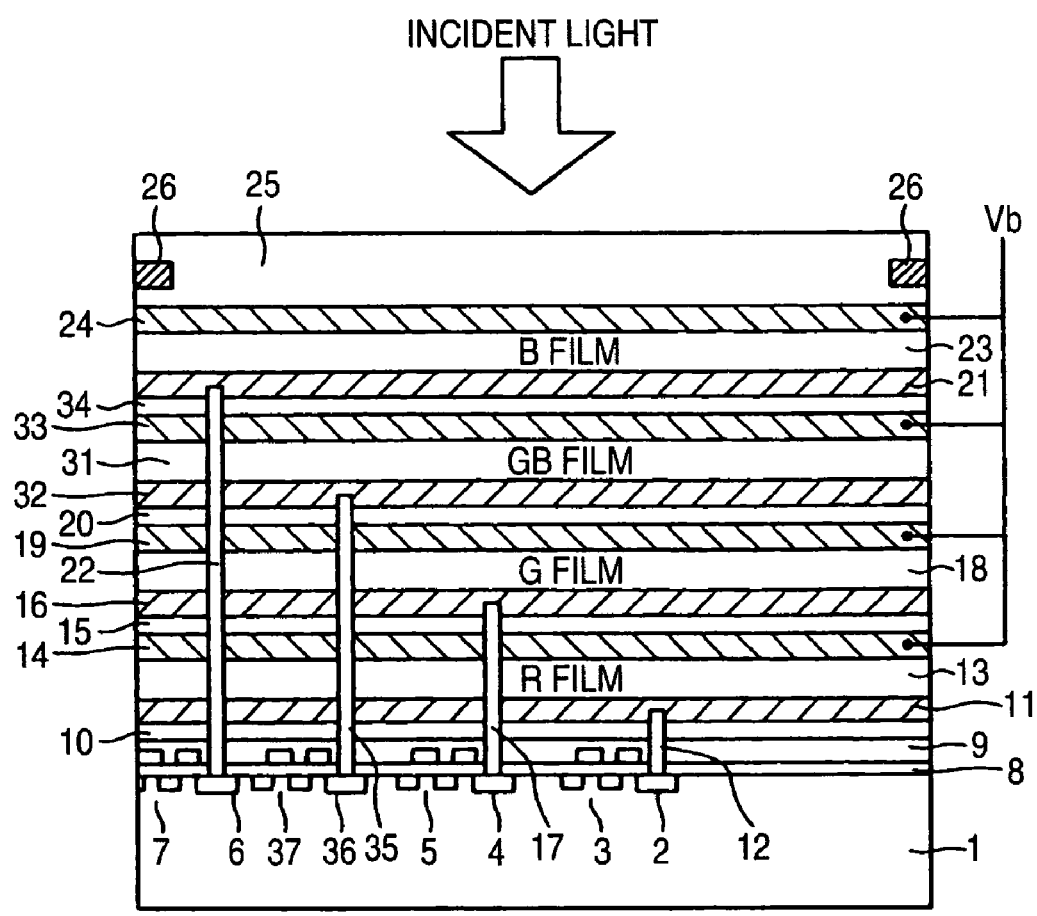
FIG. 2 is a cross-sectional schematic view of one pixel portion in the photoelectric converting film stack type solid-state image pickup device having a four-layer structure according to one embodiment of the present invention.

The embodiment shown in FIG. 1 is an example of the photoelectric converting film stack type solid-state image pickup device for detecting three primary colors of red, green and blue, but a constitution of detecting four colors may also be employed. FIG. 2 is a cross-sectional schematic view of one pixel portion in a photoelectric converting film stack type solid-state image pickup device for detecting four colors, where in addition to the constitution of FIG. 1, a layer comprising transparent electrodes 32 and 33 having interposed therein a photoelectric converting film 31 of detecting an intermediate color (GB: emerald color) between green (G) and blue (B) is provided between the layer for green color detection and the layer for blue color detection. That is, photoelectric converting films 23, 31, 18 and 13 are sequentially provided from the top in the order of increasing the wavelength of light to be detected.

In this example, the particle diameter of the quantum dot is determined such that the light absorption maximum in the photoelectric converting film 23 becomes from 420 to 480 nm, the light absorption maximum in the photoelectric converting film 31 becomes from 480 to 520 nm, the light absorption maximum in the photoelectric converting film 18 becomes from 520 to 560 nm, and the light absorption maximum in the photoelectric converting film 13 becomes from 580 to 620 nm.

A high-concentration impurity region 36 for accumulating the signal charges of intermediate color is formed on the semiconductor substrate, an electrode 35 for energizing the high-concentration impurity region 36 and the transparent electrode 32, which is electrically insulated from other constituent portions, is provided, and an MOS circuit 37 for reading out the signal charges in the high-concentration impurity region 36 is provided on the semiconductor substrate. Of course, a transparent insulating film 34 is provided between the transparent electrode film 31 and the upper transparent electrode film 21.

Figure 3:
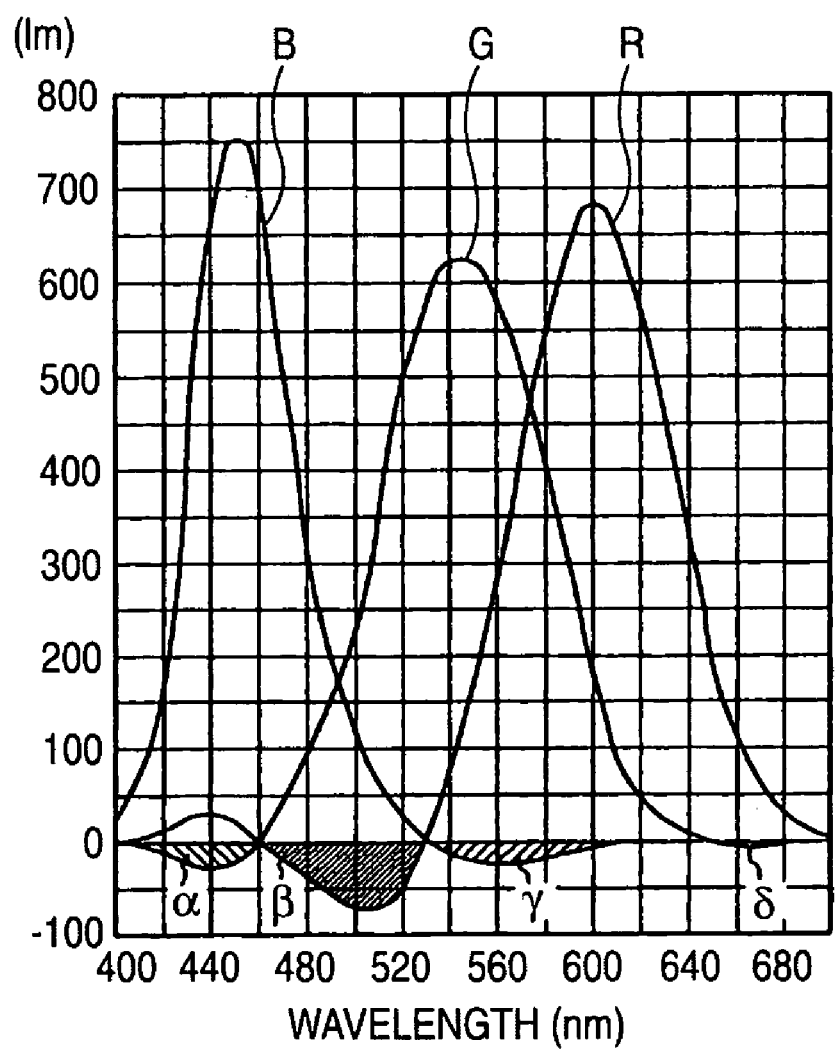
FIG. 3 is a graph showing the human luminous efficacy.

The detection of intermediate color at a wavelength of 480 to 520 nm is advantageous to correct the red color according to the human luminous efficacy. The human luminous efficacy has, as shown by $\alpha$, $\beta$, $\gamma$ in FIG. 3, negative sensitivities in green (G), red (R) and blue (B) colors. Due to these negative sensitivities, even when only positive sensitivities of R, G and B are detected by a solid-state image pickup device to perform color reproduction, the image viewed by a human being cannot be reproduced. Therefore, the largest negative sensitivity $\beta$, that is, negative sensitivity of red, is detected by the photoelectric converting film 31, and a signal processing of subtracting this negative sensitivity portion from the red sensitivity detected by the photoelectric converting film 13 is performed in the same manner as the signal processing described in Japanese Patent No. 2,872,759, whereby the human sensitivity to red color can be reproduced.

Figure 4:
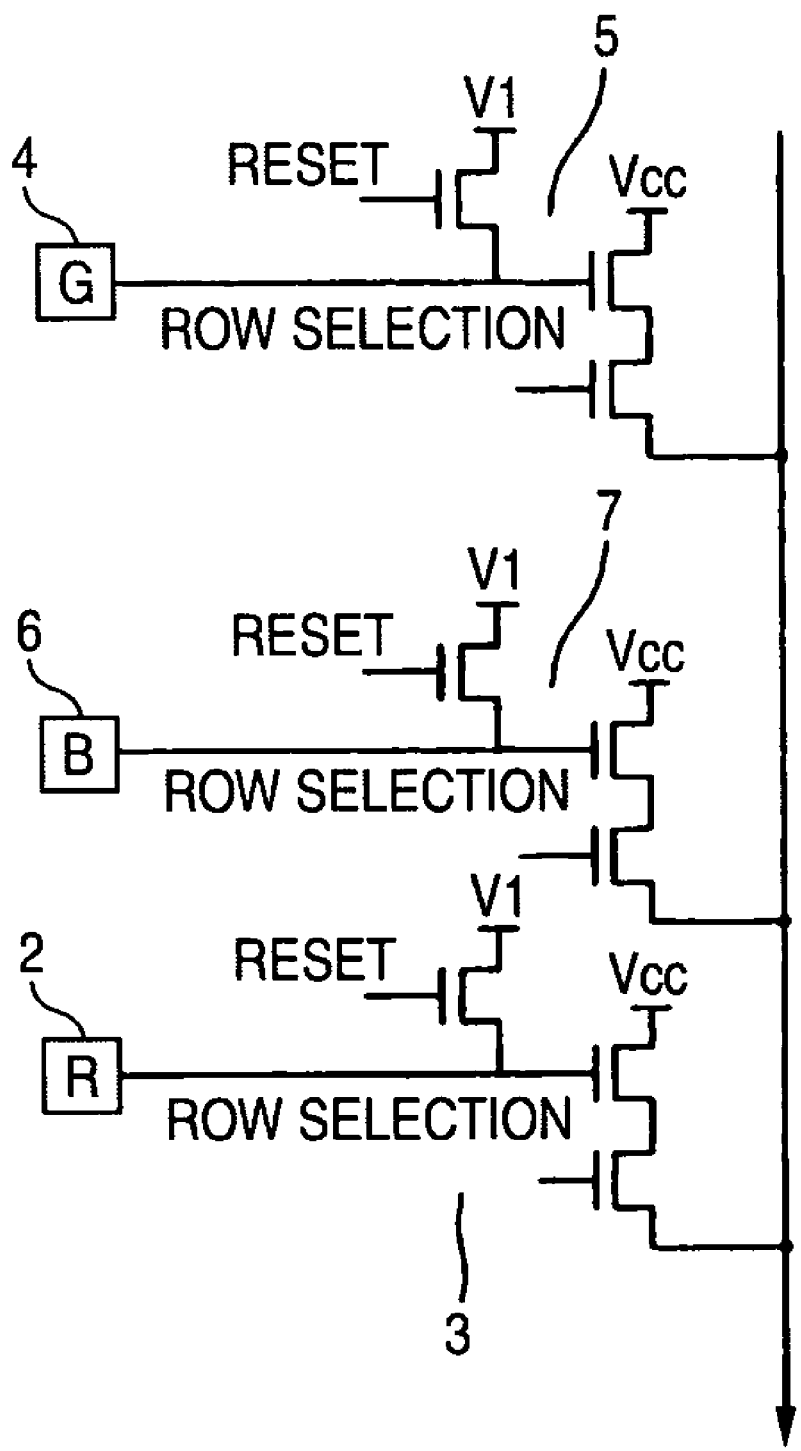
FIG. 4 is a circuitry view of the signal read circuit comprising MOS circuits.

FIG. 4 is a circuitry view of the MOS circuits 3, 5 and 7 shown in FIG. 1. The MOS circuits for R, G and B each comprises three FET elements, and the circuit constitution thereof is the same as that of the circuit used for the related-art CMOS-type image sensors. The difference in the solid-state image pickup device of FIG. 2 is only to add three FET elements for intermediate color (GB) per one pixel portion.

In the related-art CMOS-type image sensors, a "light-receiving part" must be provided on the semiconductor surface and therefore, when producing those MOS circuits on the semiconductor surface, they should be produced in a narrow space so as to assure the space for a wide light-receiving part. However, in the photoelectric converting film stack type solid-state image pickup device of this embodiment, the "light-receiving part" need not be provided on the semiconductor surface and the production of MOS circuits is facilitated. Furthermore, the wiring space can afford room and therefore, wiring connection to allow for reading of R, G and B together is also facilitated unlike the constitution of FIG. 4 where R, G and B are sequentially read out while selecting one of these by a selection signal. The same applies also to the case where the read-out circuit is not an MOS circuit but a type of providing an electric charge transfer path as in CCD-type image sensors.

In FIGS. 1 and 2, the structure of one pixel portion is shown. These pixels are vertically and horizontally arranged in an array manner on the surface side of a semiconductor substrate. The photoelectric converting film need not be stacked every each pixel, but one sheet of a photoelectric converting film may be stacked on the entire surface of the semiconductor substrate and in this case, individual pixels can be divided by forming one of the paired transparent electrodes having interposed therein each photoelectric converting film, on one pixel separately from another pixel.

When light enters into the photoelectric converting film stack type solid-state image pickup device of FIG. 1 or 2 from a subject, blue light out of the incident light is absorbed by the photoelectric converting film 23, green light is absorbed by the photoelectric converting film 18, and red light is absorbed by the photoelectric converting film 13. In the case of FIG. 2, emerald light as the intermediate color (GB) between blue and green is absorbed by the photoelectric converting film 31.

In the quantum dot (ultrafine particle) constituting the photoelectric converting film 23, the incident light is absorbed and an electron-hole pair is produced. This electron-hole pair recombines and emits blue light with the elapse of time, but when a voltage is applied between the transparent electrodes 24 and 21, the electron of the electron-hole pair penetrates the transparent electrode 21 and flows into the high-concentration impurity region 6 through the electrode 22.

Similarly, the electron produced in the photoelectric converting film 18 according to the quantity of green incident light flows into the high-concentration impurity region 4, the electron produced in the photoelectric converting film 13 according to the quantity of red incident light flows into the high-concentration impurity region 2, and the electron according to the quantity of emerald incident light flows into the high-concentration impurity region 36 (FIG. 2). Then, the electrons of electric charges corresponding to respective colors are read outside by the MOS circuits 3, 5, 7 and 37.

Figure 5:
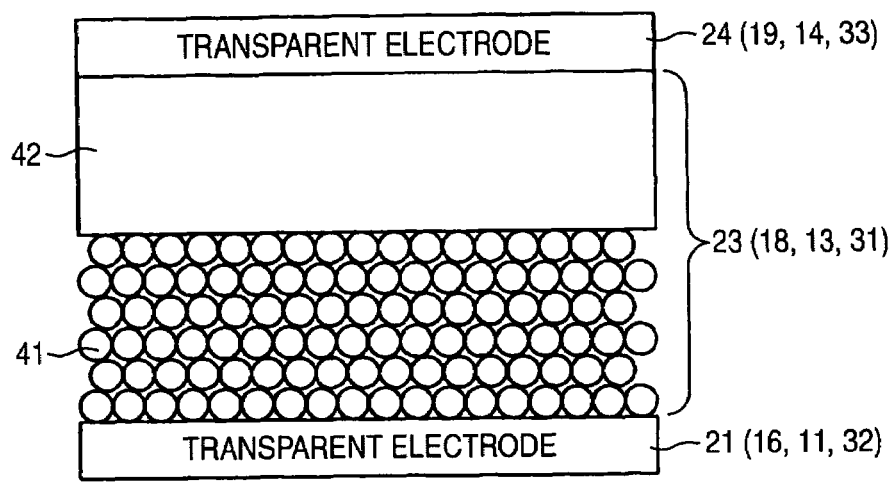
FIG. 5 is a cross-sectional schematic view of the photoelectric converting film according to one embodiment of the present invention.

FIG. 5 is a cross-sectional schematic view of the photoelectric converting films 23, 18, 13 and 31. The photoelectric converting film 23 (the same applies to 18, 13 and 31 which are differing only in the particle size of the quantum dot) provided between the transparent electrode films 24 and 21 comprises numerous deposited CdSe quantum dots 41 with ZnS shell and a hole transport layer 42 stacked thereon. The hole transport layer 42 is formed of a material having a band gap larger than that of the quantum dot 41.

In this example, the hole transport layer 42 is suitably constituted by a ZnS layer, but the present invention is not limited thereto. For example, as long as the hole transport layer 42 is an organic film and the constituent molecule thereof can transport a hole from the photosensitive molecular film, there is no particular limitation. Examples of the molecule which can be used include organic molecules having a skeleton such as p-phenylenediamine, o-phenylenediamine, m-phenylenediamine, tetrathiafulvalene, diselenadithiafulvalene, tetraselenafulvalene, tetraselenotetracene, quinoline, acridine, ferrocene, benzidine, diaminopyrene, polydiacetylene, hydroquinone, dimethoxybenzene, diazobenzene and phenothiazine.

Figure 6:
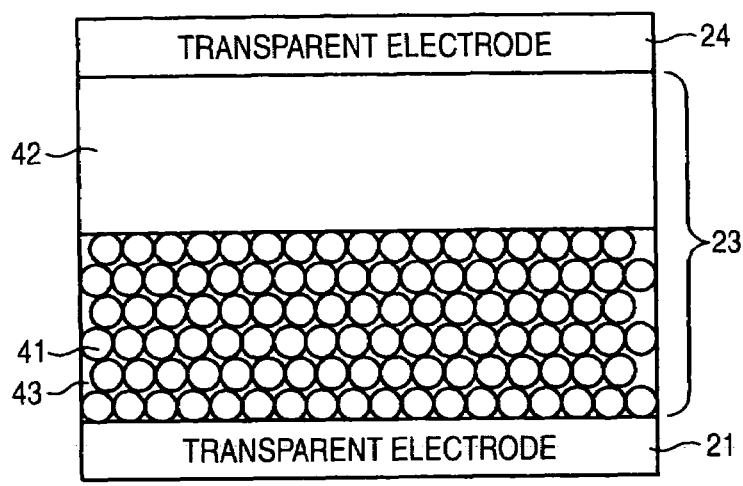
FIG. 6 is a cross-sectional schematic view of the photoelectric converting film according to another embodiment of the present invention.

FIG. 6 is a cross-sectional schematic view of the photoelectric converting films 23, 18, 13 and 31 according to another embodiment. The difference from the embodiment shown in FIG. 5 is in that a layer obtained by depositing numerous CdSe quantum dots 41 with ZnS shell is provided in FIG. 5, whereas numerous CdSe quantum dots 41 with ZnS shell are dispersed in an electron transport layer 43 in this embodiment.

The molecule constituting the electron transport layer 43 is not particularly limited as long as it can transport an electron from the photosensitive molecular film, and examples of the molecule which can be used include organic molecules having a skeleton such as tetracyanoquinodimethane, benzoquinone, naphthoquinone, anthraquinone, dinitrobenzene, trinitrobenzene, tricyanobenzene, hexacyanobenzene, trinitrofluolenone, chlorobenzoquinone, dichlorobenzoquinone, trichlorobenzoquinone, dichlorodicyanobenzoquinone, cyanobenzoquinone, dicyanobenzoquinone, tricyanobenzoquinone, N,N'-dicyanoquinonediimine, N,N'-disulfonylquinonediimine, N-carbonyl-N'-cyanoquinonediimine, N-carbonyl-N'-sulfonylquinonediimine, N-sulfonyl-N'-cyanoquinonediimine, N-sulfonylquinoneimine, N-cyanoquinoneimine and dithienylene copper complex. Also, such an organic molecule may be dispersed in a polymer working out to the electron transport layer.

The photoelectric converting film 23 and the like can be produced as follows. Numerous CdSe quantum dots overcoated with ZnS are produced and dispersed in an organic solvent, and the dispersion is coated on the transparent film 21 by spin coating or the like and dried. The drying is preferably performed in vacuum. Thereafter, the hole transport layer 42 is formed by vacuum deposition, sputtering or the like, and then the transparent electrode film 24 is formed by vapor deposition, sputtering or the like, thereby completing the photoelectric converting film 23 interposed between transparent electrode films 24 and 21. In this case, ZnS preferably contains a p-type impurity.

The production method of the CdSe quantum dot 41 with ZnS shell is not particularly limited and the method described in B. O. Dabbousi et al., "(CdSe)ZnS Core-Shell Quantum Dots Synthesis and Characterization of a Size Series of Highly Luminescent Nanocrystallites", *J. Phys. Chem. B* 1997, 101, 9463-975 may be used. That is, a sulfide shell such as zinc sulfide (ZnS) or CdS is formed by a reaction method of contacting a semiconductor ultrafine particle with water, such as reverse micelle process or aqueous solution reaction. The formation of a ZnS shell on a CdS core is reported in B. S. Zou et al., *International Journal of quantum Chemistry*, Vol. 72, 439-450 (1999), and the formation of a CdS shell on a CdSe core is reported in L. Xu et al., *J. Mater. Sci.*, Vol. 35, 1375-1378 (2000).

If the CdSe quantum dot with ZnS shell is merely used as the photoelectric converting film, it is difficult to efficiently take out electrons according to the color signals, but as in this embodiment, when the CdSe quantum dot with ZnS shell is used together with a hole transport film 42, electrons according to the color signals can be efficiently taken out. Furthermore, as shown in FIG. 6, when an electron transport layer 43 is provided, the color signals can be more easily taken out.

As for the thickness of the thus-formed photoelectric converting film 23, for example, in the case of a photo-electric converting film of photoelectrically converting blue light, the thickness is preferably large enough to allow for satisfactory absorption of blue light and no entering of the blue light into the next layer. If the blue light enters into the next photoelectric converting film layer for green light and causes photoexcitation, bad color separation results.

In order to move the signal charges to the corresponding high-concentration impurity region 2 or the like from the photoelectric converting film, a technique of taking out signals from a light-receiving element of normal CCD-type image sensors or CMOS-type image sensors may be applied. Examples thereof include a method of injecting a constant amount of bias charges into the high-concentration impurity region 2 or the like (accumulation diode) (refresh mode) and after accumulating a predetermined amount of electric charges (photoelectric conversion mode), reading out the signal charges. The photoelectric converting film itself may be used as the accumulation diode, or an accumulation diode may be separately provided.

For reading out the signal charges moved to the high-concentration impurity region 2 or the like, a read-out technique in normal CCD-type image sensors or CMOS-type image sensors can be applied as-is.

In the related art, the solid-state image pickup device such as CCD comprises a light-receiving element having a photoelectric conversion function and is imparted with functions of, for example, accumulating the converted signals, reading out the accumulated signals and selecting the pixel position. The signal charges or signal currents resulting from photoelectric conversion in the light-receiving part are accumulated in the light-receiving part itself or in a capacitor provided separately, and the electric charges accumulated are read out simultaneously with selection of the pixel position by the technique of so-called charge coupled device (CCD) or MOS-type image pickup device (so-called CMOS sensor) using an X-Y address system.

The CCD-type image sensor comprises a charge transfer part of transferring the pixel charge signals to an analogue shift register by a transfer switch, and a method of sequentially reading out the signals to the output terminal by the operation of register is used. For example, a line address-type system, a frame transfer-type system, an interline transfer-type system and a frame interline transfer-type system are known. Also, a two-phase structure, a three-phase structure, a four-phase structure, an embedded channel structure and the like are known for CCD, and an arbitrary structure thereof may be employed for the vertical transfer path in the photoelectric converting film stack type solid-state image pickup device of the present invention.

The address selection system includes a system of sequentially selecting each one of the pixels by a multiplexer switch and a digital shift register, and reading it out as a signal voltage (or electric charge) to a common output line. The image pickup device using a two-dimensionally arrayed X-Y address scanning system is known as a CMOS sensor. In this system, a switch provided in a pixel connected to the X-Y intersection is connected to a vertical shift register, and the signal read out from the pixel provided in the same row as that where the switch is turned on by a voltage from the vertical scanning shift register, is read out to the output line in the column direction. These signals are sequentially read out from the output terminal through a switch driven by the horizontal scanning shift register.

The output signal can be read out by using a floating diffusion detector or a floating gate detector. Also, the S/N property may be enhanced by providing a signal amplification circuit in the pixel portion or using a correlated double sampling technique.

As for the signal processing, gamma correction by an ADC circuit, digitization by an AD converter, luminance signal processing, or color signal processing can be applied. Examples of the color signal processing include white balance processing, color separation processing and color matrix processing. In the case of using an NTSC signal, a processing of converting RGB signals into YIQ signals can be applied. These are the same as those used in the related-art CCD-type image sensors or CMOS-type image sensors.

In the above-described embodiment, a CdSe quantum dot with ZnS shell is used, but the ultrafine particle material is not limited thereto and may be sufficient if it is an ultrafine particle obtained by coating a core with a material having a band gap larger than the band gap of a quantum dot working out to the core. For example, an ultrafine particle using an InN quantum dot as the core may be used. And, by forming the electron transport layer and the hole transport layer each from a GaN quantum dot, the signal charge after photoelectric conversion can be efficiently taken out from the photoelectric converting film. The same applies to the case where the core is CdS and the material coated on the core is ZnS.

In the above-described embodiment, a microlens, an infrared cut filter and an ultraviolet cut filter are not referred to, but in the constitutions of FIGS. 1 and 2, an infrared cut filter may be provided on the lowermost or uppermost layer, or a microlens may be used to elevate the degree of light condensation. Also, an ultraviolet cut filter may be provided on the uppermost layer or interposed at an appropriate portion between the lens and the photoelectric converting film.

Furthermore, in the photoelectric converting film stack type solid-state image pickup device of this embodiment, when the photoelectric converting film is constituted in a three-layer or four-layer structure, various advantageous effects can be obtained. For example, the image picked up can be free from generation of moire, one pixel can detect R, G and B together to eliminate the use of an optical low pass filter and realize high resolution, both luminance and color can be satisfactorily resolved without color bleeding, good reproducibility of hair and the like can be attained by virtue of simple signal processing and no generation of pseudo-signal, the mixing or partial reading of pixels can be facilitated, a numerical aperture of 100% can be obtained even without using a microlens, and shading does not occur due to no restriction in the eye point distance to the image pickup lens, thereby ensuring suitability for lens-interchangeable cameras and contributing to thinning of the lens. In this way, the problems of the related-art CCD-type or CMOS-type image sensors can be overcome.

According to the present invention, a photoelectric converting film stack type solid image pickup device capable of efficiently taking out the photoelectric charges (signal charges) from the photoelectric converting film can be provided.

The photoelectric converting film stack type solid-state image pickup device of the present invention can be used in place of the related-art CCD-type or CMOS-type image sensors and is useful when mounted on a digital camera and the like because one pixel can be made larger than in the related-art techniques and therefore, the sensitivity can be elevated.

The entire disclosure of each and every foreign patent application from which the benefit of foreign priority has been claimed in the present application is incorporated herein by reference, as if fully set forth.

What is claimed is:

1. A photoelectric converting film stack type solid-state image pickup device comprising:
    a semiconductor substrate in which a signal read circuit is formed; and
    at least one photoelectric converting film interposed between two electrode films, said at least one photoelectric converting film being stacked above the semiconductor substrate,
    wherein a signal corresponding to an intensity of incident light is read outside by the signal read circuit, the signal being generated by photoelectric conversion with the photoelectric converting film,
    wherein the photoelectric converting film comprises:
        a first layer comprising: an ultrafine particle including (i) a quantum dot contributing to the photoelectric conversion and (ii) a material having a band gap larger than that of the quantum dot, the quantum dot being coated with the material; and
        a hole transport layer stacked on the first layer, wherein the first layer further comprises an electron transport layer, and the ultrafine particle is dispersed in the electron transport layer.

2. The photoelectric converting film stack type solid-state image pickup device as claimed in claim 1, wherein the hole transport layer comprises a semiconductor having a bad gap larger than that of the quantum dot.

3. The photoelectric converting film stack type solid-state image pickup device as claimed in claim 2, wherein the semiconductor of the hole transport layer is doped with an impurity.

4. The photoelectric converting film stack type solid-state image pickup device as claimed in claim 1, wherein the hole transport layer comprises an organic film.

5. The photoelectric converting film stack type solid-state image pickup device as claimed in claim 1, wherein the quantum dot comprises CdSe or CdS and the material coated on the quantum dot is ZnSe or ZnS.

6. The photoelectric converting film stack type solid-state image pickup device as claimed claim 1, wherein said at least one photoelectric converting film comprises three photoelectric converting film layers which are stacked through a transparent insulating film, each of said at least one photoelectric converting film being interposed between two transparent electrode films.

7. The photoelectric converting film stack type solid-state image pickup device as claimed in claim 6, wherein an average particle diameter of the ultrafine particle in each of said photoelectric converting films is determined such that first one of the three photoelectric converting film layers has a light absorption maximum at a wavelength of 400 to 500 nm, second one of the three photoelectric converting film layers has a light absorption maximum at a wavelength of 500 to 560 nm, and third one of the three photoelectric converting film layers a light absorption maximum at a wavelength of 560 to 640 nm.

8. The photoelectric converting film stack type solid-state image pickup device as claimed in claim 1, wherein said at least one photoelectric converting film comprises four photoelectric converting film layers which are stacked through a transparent insulating film, each of said at least one photoelectric converting film being interposed between two transparent electrode films.

9. The photoelectric converting film stack type solid-state image pickup device as claimed in claim 8, wherein an average particle diameter of the ultrafine particle in each of said photoelectric converting films is determined such that first one of the four photoelectric converting film layers has a light absorption maximum at a wavelength of 420 to 480 nm, second one of the four photoelectric converting film layers has a light absorption maximum at a wavelength of 480 to 520 nm, third one of the four photoelectric converting film layers a light absorption maximum at a wavelength of 520 to 560 nm, and fourth one of the four photoelectric converting film layers a light absorption maximum at a wavelength of 560 to 620 nm.

10. The photoelectric converting film stack-type solid-state image pickup device as claimed in claim 9, wherein a red color signal amount is determined by subtracting a second amount of signals detected by the second photoelectric converting film layer from a fourth amount of signals detected by the fourth photoelectric converting film layer.

* * * * *